(12) United States Patent
Park

(10) Patent No.: US 7,109,640 B2
(45) Date of Patent: Sep. 19, 2006

(54) HOLOGRAPHIC APPARATUS AND METHOD ADOPTING ACTUATED MIRROR

(75) Inventor: Joo Youn Park, Seoul (KR)

(73) Assignee: Daewoo Electronics Corporation, Seoul (KR)

( * ) Notice: Subject to any disclaimer, the term of this patent is extended or adjusted under 35 U.S.C. 154(b) by 226 days.

(21) Appl. No.: 10/852,164

(22) Filed: May 25, 2004

(65) Prior Publication Data

US 2004/0240008 A1 Dec. 2, 2004

(30) Foreign Application Priority Data

May 31, 2003 (KR) .................... 10-2003-0035034

(51) Int. Cl.
*H02N 2/02* (2006.01)
*H02N 2/04* (2006.01)
(52) U.S. Cl. ................................ 310/328; 310/323.17
(58) Field of Classification Search ........... 310/323.17, 310/328
See application file for complete search history.

(56) References Cited

U.S. PATENT DOCUMENTS

| 4,736,132 | A | * | 4/1988 | Culp | ................ 310/333 |
| 5,892,597 | A | | 4/1999 | Iwata et al. | |
| 6,157,473 | A | * | 12/2000 | Jang et al. | ................ 359/22 |
| 6,252,333 | B1 | * | 6/2001 | Iino et al. | ............ 310/323.17 |
| 6,507,543 | B1 | | 1/2003 | Fujimaki et al. | |
| 6,720,551 | B1 | * | 4/2004 | Cleveland et al. | ........... 250/234 |
| 7,002,138 | B1 | * | 2/2006 | Cleveland et al. | ........... 250/234 |
| 7,019,874 | B1 | * | 3/2006 | Park | ................ 359/30 |
| 2002/0005679 | A1 | * | 1/2002 | Elings et al. | ........... 310/323.12 |
| 2002/0054403 | A1 | | 5/2002 | Monaghan et al. | |
| 2002/0176127 | A1 | | 11/2002 | Gamer | |
| 2005/0041910 | A1 | * | 2/2005 | Will et al. | ................ 385/17 |

FOREIGN PATENT DOCUMENTS

| JP | 63-298208 | 12/1988 |
| JP | 2004-74166 | 3/2004 |

* cited by examiner

*Primary Examiner*—Thomas M. Dougherty
(74) *Attorney, Agent, or Firm*—Bacon & Thomas, PLLC

(57) ABSTRACT

A holographic apparatus including an actuated mirror includes a fixed body having a first piezo-actuator protrudingly installed thereat; a movable body rectilinearly movable and having a second piezo-actuator protrudingly installed thereat; a rotatable body mounting thereon a mirror and rotatably installed at the movable body; and springs for connecting the fixed body and the movable body and connecting the movable body and the rotatable body to enable a rotational movement of the rotatable body and a rectilinear movement of the movable body. A first prominence is installed at the movable body and in contact with a first piezo-actuator and a second prominence is installed at the rotatable body and in contact with a second piezo-actuator. Moreover, the first and the second piezo-actuators are controllable to be expanded or contracted.

7 Claims, 4 Drawing Sheets

HOLOGRAPHIC APPARATUS AND METHOD ADOPTING ACTUATED MIRROR

FIELD OF THE INVENTION

The present invention relates to a holographic apparatus and method adopting an actuated mirror; and, more particularly, to a holographic apparatus and method including an actuated mirror capable of controlling a reference beam to be incident upon a same location on a holographic medium irrespective of an angle of incidence of the reference beam toward the holographic medium during reconstruction.

BACKGROUND OF THE INVENTION

As is well known, demands for a holographic digital data storage system that can store a large amount of data have been increasing. Therefore, various types of holographic digital data storage system have been recently developed for realizing high density storage capabilities.

The holographic digital data storage system allows a signal beam having information therein to interfere with a reference beam to generate an interference pattern therebetween and, then, controls the interference pattern to be stored in a storage medium made of an optical refractive crystal. The optical refractive crystal is a material which may react differently on different amplitudes and phases of the interference pattern.

Various holograms can be recorded in a same spatial location by changing an angle of incidence of the reference beam (angular multiplexing) and/or by moving the storage medium (holographic medium) to change a recording area (shift multiplexing), so that a great number of holograms of binary data can be stored in the storage medium.

Hereinafter, a conventional holographic digital data storage system, e.g., a holographic ROM system, using the angular multiplexing technique will be described with reference to FIGS. 1A and 1B (refer to "Holographic ROM system for high-speed replication", ISOM/ODS 2002, pp. 144~146).

As shown in FIG. 1A, the holographic ROM system includes a pick-up unit 100, a holographic medium 200, a motor 210, a control unit 300 and a signal processing unit 400. A plurality of data is recorded on the holographic medium 200 by using the angular multiplexing technique. The holographic medium 200 is rotated by the motor 210 operated under control of the control unit 300 during playback.

The pick-up unit 100 includes a case 101, a first actuator 102, a laser source 104, a PBS (polarization beam splitter) 106, an actuated mirror 108, an aperture 110, an objective lens 112, a second actuator 114 and a light receiving unit 116. Provided in the case 101 are the first actuator 102, the laser source 104, the PBS 106, the actuated mirror 108 and the light receiving unit 116.

During playback, the laser source 104 emits a laser beam with a constant wavelength, e.g., a wavelength of 532 nm. The laser beam of, e.g., only S type of linear polarization is provided to the PBS 106.

The PBS 106, which is manufactured by repeatedly depositing at least two kinds of materials, each having a different refractive index, serves to transmit one type of polarized laser beam, e.g., P-polarized beam, and reflect the other type of polarized laser beam, e.g., S-polarized beam. Therefore, the PBS 106 reflects the reference beam toward the actuated mirror 108.

The reflected reference beam undergoes another reflection at a predetermined angle by the actuated mirror 108, thereby being incident upon the holographic medium 200. In order to retrieve and reconstruct holographic data, the angle of incidence of the reference beam toward the holographic medium 200 should be identical to that of a reference beam employed during a recording operation.

When the reference beam reflected at the predetermined angle by the actuated mirror 108 is irradiated onto the holographic medium 200, the interference pattern recorded in the holographic medium 200 diffracts the reference beam to thereby create a reconstructing beam.

The reconstructing beam travels into the case 101 via the aperture 110 and the objective lens 112, and the objective lens 112 can be moved by the second actuator 114. Elements in the pick-up unit 100 can be moved by the first actuator 102. Furthermore, the case 101 is configured not to obstruct the traveling of the light.

After passing through the objective lens 112, the reconstructing beam is transmitted to the PBS 106 and then is reflected toward the light receiving unit 116 by the PBS 106.

The reconstructing beam received by the light receiving unit 116 is reproduced by the signal processing unit 400.

The holographic ROM system reproduces data, which have been overlappingly recorded at a first angle of incidence on the holographic medium 200 by using a reference beam having a phase conjugation with respect to the first angle, after which the actuated mirror 108 should be rotated in order to reproduce data, which have been overlappingly recorded at a second angle of incidence on the holographic medium 200 by using a reference beam having a phase conjugation with respect to the second angle.

Through the repetition of the above processes, the holographic ROM system reproduces the data recorded by the angular multiplexing technique.

However, if an angle of incidence of the reference beam toward the holographic medium 200 is changed, the incidence location thereof on the holographic medium 200 is changed and, accordingly, a radiating point of the reconstructing beam on the hologram medium 200 is also changed, as shown in FIG. 1B. Therefore, the reconstructing beam is deviated from an optical axis of the objective lens 112, so that a distortion of the reconstructing beam occurs thereby raising a problem of not being able to reproduce the data recorded on the holographic medium 200 exactly. As an extreme case, the reconstructing beam may be totally deviated from the objective lens 112, which may result in failure to reproduce the data recorded on the holographic medium 200.

SUMMARY OF THE INVENTION

It is, therefore, an object of the present invention to provide a holographic apparatus and method including an actuated mirror capable of controlling a reference beam to be incident upon a same location on a holographic medium irrespective of an angle of incidence of the reference beam toward the holographic medium during reconstruction.

In accordance with one aspect of the invention, there is provided a holographic apparatus including an actuated mirror including: a fixed body having a first piezo-actuator protrudingly installed thereat; a movable body rectilinearly movable and having a second piezo-actuator protrudingly installed thereat; a rotatable body mounting thereon a mirror and rotatably installed at the movable body; and springs for connecting the fixed body and the movable body and connecting the movable body and the rotatable body to enable a rotational movement of the rotatable body and a rectilinear movement of the movable body, wherein a first prominence is installed at the movable body and in contact with a first piezo-actuator; and a second prominence is installed at the rotatable body and in contact with a second piezo-actuator; and wherein the first and the second piezo-actuators are controllable to be expanded or contracted.

In accordance with another aspect of the invention, there is provided a holographic apparatus including an actuated mirror including: a base; a fixed body fixedly installed on the base and having a first piezo-actuator protrudingly installed thereat; a movable body installed on the base to be rectilinearly movable thereon and having a second piezo-actuator protrudingly installed thereat; a rotatable body rotatably connected to the movable body and mounting thereon a mirror; springs for connecting the fixed body and the movable body and connecting the movable body and the rotatable body to enable a rotational movement of the rotatable body and a rectilinear movement of the movable body; a first prominence installed at the movable body and in contact with a first piezo-actuator; a second prominence installed at the rotatable body and in contact with a second piezo-actuator; and a control unit for either expanding or contracting the first and the second piezo-actuators.

In accordance with still another aspect of the invention, there is provided a holographic method including the steps of: generating a laser beam; reflecting the laser beam toward an actuated mirror; and reflecting the laser beam by the actuated mirror to be incident on a holographic medium, wherein the actuated mirror changes an angle of incidence of the laser beam toward the holographic medium, and an incidence point of the laser beam on the holographic medium is unchanged though the angle of incidence thereof is changed.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENT

Figure 2:
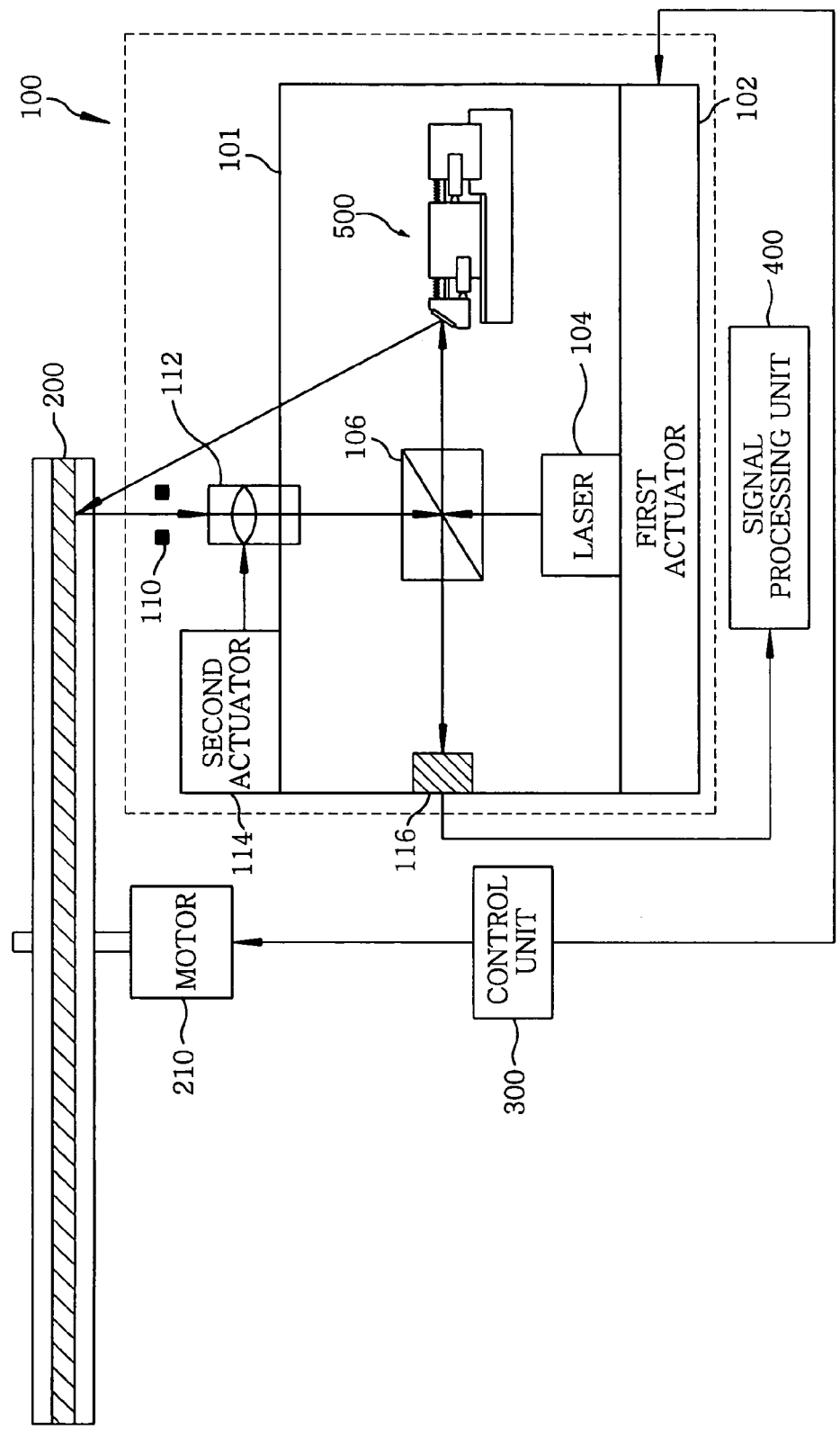
FIG. 2 illustrates a holographic ROM system in accordance with a preferred embodiment of the present invention.
Figure 3:
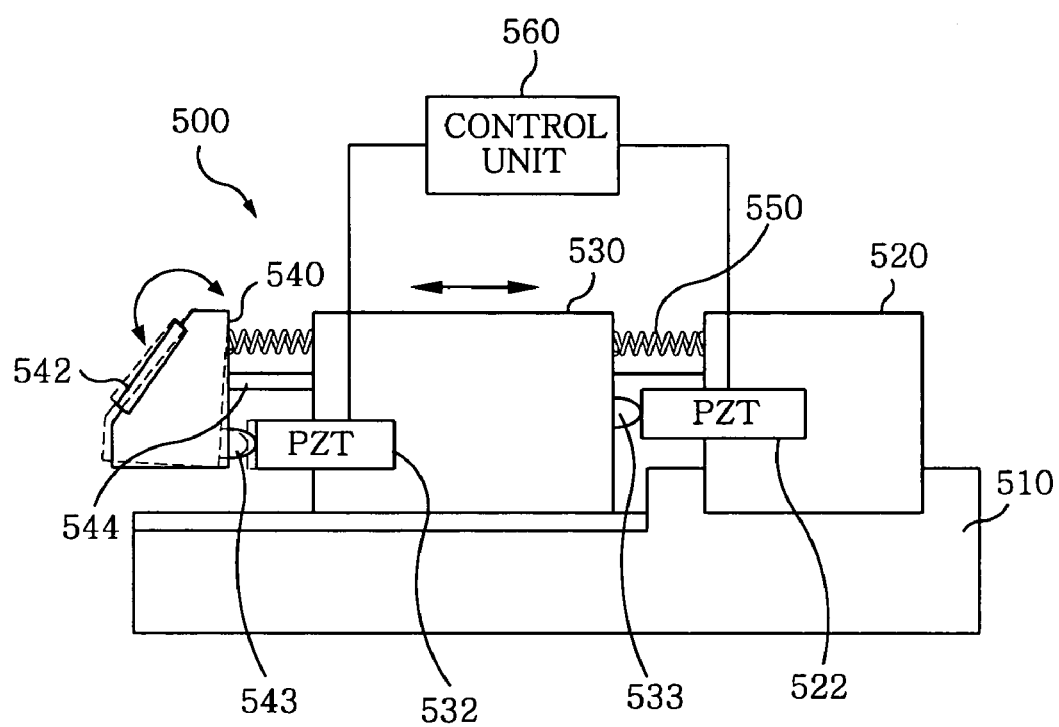
FIG. 3 offers an actuated mirror employed in the holographic ROM system illustrated in FIG. 2 in detail.

There are shown in FIGS. 2 and 3 a holographic apparatus, e.g., a holographic ROM, and an actuated mirror unit employed therein, respectively, in accordance with a preferred embodiment of the present invention.

Figure 1A:
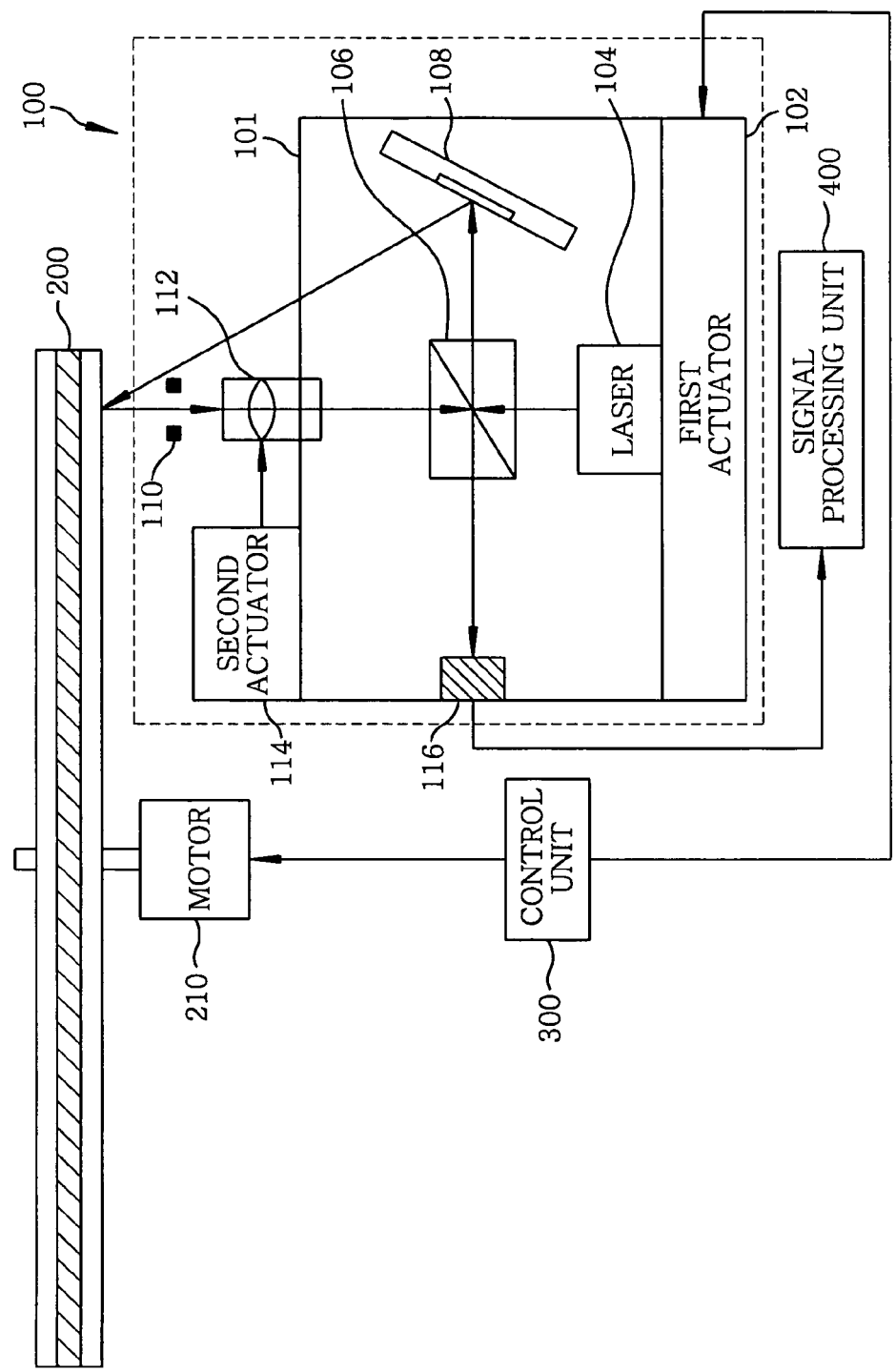
FIGS. 1A and 1B show a conventional holographic ROM system.
Figure 1B:
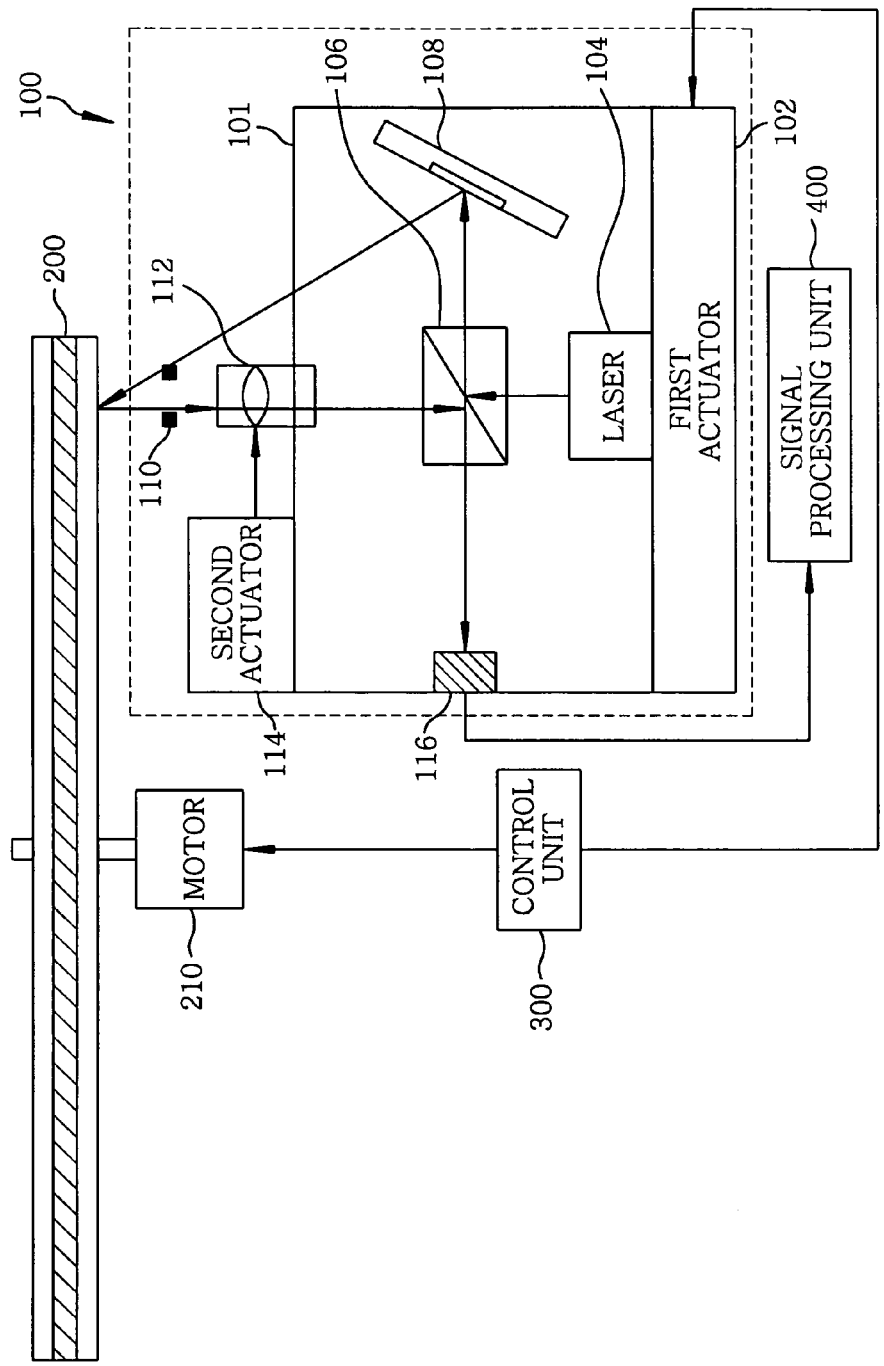

Since the only difference between a holographic apparatus of the present invention and that of the prior art shown in FIGS. 1A and 1B lies on an actuated mirror unit, the same names and reference numerals are used to denote identical elements other than the actuated mirror unit, and the detailed description thereof will be omitted.

As shown in FIG. 2, the holographic apparatus includes a pick-up unit 100, a holographic medium 200, a motor 210, a control unit 300 and a signal processing unit 400. A plurality of data is recorded on the holographic medium 200 by using the angular multiplexing technique. The holographic medium 200 is rotated by the motor 210 operated under control of the control unit 300 during playback.

The pick-up unit 100 includes a case 101, a first actuator 102, a laser source 104, a PBS (polarization beam splitter) 106, an actuated mirror unit 500, an aperture 110, an objective lens 112, a second actuator 114 and a light receiving unit 116.

The actuated mirror unit 500 in accordance with the present invention is provided with a base 510, a fixed body 520, a movable body 530 and a rotatable body 540 as illustrated in FIG. 3.

The base 510 has a shape of, e.g., a rectangular plate, on which the fixed body 520 and the movable body 530 are installed.

The fixed body 520 is fixedly installed on the base 510 and has a first piezo-actuator 522 installed at a side surface thereof which faces the movable body 530, wherein a part of the first piezo-actuator 522 is embedded in the fixed body 520 and the remaining part thereof is protruded therefrom.

Furthermore, the movable body 530 slidably installed on the base 510 can be rectilinearly moved thereon. Installed at an opposite side surface of the movable body 530 with respect to the side surface thereof facing the fixed body 520 is the rotatable body 540 mounting thereon a mirror 542. The rotatable body 540 is connected to the opposite side surface of the movable body 530 through a pivot 544 serving as a center of gyration. The pivot 544 allows the rotatable body 540 to be rotated. Provided at the opposite side surface of the movable body 530 which faces the rotatable body 540 is a second piezo-actuator 532 having the same shape as the first piezo-actuator 522.

Prepared between the fixed body 520 and the movable body 530 and between the movable body 530 and the rotatable body 540 are springs 550 for collinearly connecting the fixed body 520, the movable body 530 and the rotatable body 540. The springs 550 enable the rotatable body 540 to be rotationally moved and the movable body 530 to be rectilinearly moved.

Prominences 533 and 543 are protrudingly formed at the side surface of the movable body 530 which faces the fixed body 520 and the side surface of the rotatable body 540 which faces the movable body 530, respectively. The prominences 533 and 543 are in contact with the first and the second piezo-actuators 522, 532, respectively.

A control unit 560 controls the first and the second piezo-actuators 522, 532.

Operation of the actuated mirror unit 500 employed in the holographic apparatus will be explained.

Referring to FIG. 2, a reference beam for reproducing data superimposedly recorded on the holographic medium 200 is directed toward the holographic medium 200 with a first angle of incidence after begin reflected by the actuated mirror unit 500.

Subsequently, the mirror 542 included in the actuated mirror unit 500 is rotated in a predetermined degree to reconstruct data superimposedly recorded at a second angle of incidence. In such case, according to the prior art, the reference beam may strike an unintended location on the holographic medium 200. However, in accordance with the present invention, the actuated mirror unit 500 controls the incidence point on the holographic medium 200 by rectilinearly moving the movable body 530 and rotating the rotatable body 540 so that the reference beam can strike a wanted location on the holographic medium 200.

By applying a high frequency voltage to the first piezo-actuator 522, the first piezo-actuator 522 is expanded, thereby allowing the movable body 530 to move. Such expansion of the first piezo-actuator 522 applies pressure to the prominence 533 of the movable body 530, so that the movable body 530 is slidably moved toward the rotatable body 540 on the base 510. At this time, the spring 550 between the fixed body 520 and the movable body 530 is also extended. The destination of the movable body 530 is determined by the control unit 560 such that the incidence point on the holographic medium 200 can completely coincide with a data area to be reconstructed.

In case a high frequency voltage is applied to the second piezo-actuator 532, the second piezo-actuator 532 may put the pressure on the prominence 543 in a similar manner as described above, by which the rotatable body 540 is rotated about the pivot 544 thereby compressing the spring 550 between the movable body 530 and the rotatable body 540. The rotational angle of the rotatable body 540 is controlled by the control unit 530.

By repetition of the moving and the rotating operations as described above, the holographic apparatus reconstructs a plurality of data recorded by the angular multiplexing technique.

On the other hand, in case the fist and the second piezo-actuators 522, 532 are contracted by the control unit 560, the movable body 530 is moved back to an original position by the restitutive force of the spring 550 and the rotatable body 540 is also rotated back to an original angular position.

As described above, though the angle of incidence of the reference beam is changed, the actuated mirror unit 500 enables the reference beam to be incident on a wanted location on the holographic medium 200 by rotating the rotatable body 540 and rectilinearly moving the movable body 530, so that the plurality of data can be detected with a high reliability.

As explained hitherto, in the holographic apparatus and method including the actuated mirror in accordance with the present invention, when the holographic medium recorded by the angular multiplexing technique is replayed, e.g., by a holographic player, the incidence point of the reference beam on the holographic medium is not changed despite the variation of the angle of incidence thereof to thereby minimize the distortion of the replayed data.

While the invention has been shown and described with respect to the preferred embodiments, it will be understood by those skilled in the art that various changes and modifications may be made without departing from the spirit and scope of the invention as defined in the following claims.

What is claimed is:

1. A holographic apparatus comprising an actuated mirror including:
    a fixed body having a first piezo-actuator protrudingly installed thereat;
    a movable body rectilinearly movable and having a second piezo-actuator protrudingly installed thereat;
    a rotatable body mounting thereon a mirror and rotatably installed at the movable body; and
    springs for connecting the fixed body and the movable body and connecting the movable body and the rotatable body to enable a rotational movement of the rotatable body and a rectilinear movement of the movable body,
    wherein a first prominence is installed at the movable body and in contact with a first piezo-actuator; and a second prominence is installed at the rotatable body and in contact with a second piezo-actuator; and
    wherein the first and the second piezo-actuators are controllable to be expanded or contracted.

2. The holographic apparatus of claim 1, wherein the movable body and the fixed body are installed on a base and the movable body is rectilinearly movable on the base.

3. The holographic apparatus of claim 1, wherein the rotatable body is connected to the movable body via a pivot serving as a center of gyration.

4. The holographic apparatus of claim 1, wherein in case a high frequency voltage is applied to the first and the second piezo-actuators respectively, the first and the second piezo-actuators are expanded respectively.

5. The holographic apparatus of claim 1, wherein a laser beam incident on the mirror is reflected toward a wanted location on a holographic medium by a movement of the movable body and a rotation of the rotatable body.

6. A holographic apparatus comprising an actuated mirror including:
    a base;
    a fixed body fixedly installed on the base and having a first piezo-actuator protrudingly installed thereat;
    a movable body installed on the base to be rectilinearly movable thereon and having a second piezo-actuator protrudingly installed thereat;
    a rotatable body rotatably connected to the movable body and mounting thereon a mirror;
    springs for connecting the fixed body and the movable body and connecting the movable body and the rotatable body to enable a rotational movement of the rotatable body and a rectilinear movement of the movable body;
    a first prominence installed at the movable body and in contact with a first piezo-actuator;
    a second prominence installed at the rotatable body and in contact with a second piezo-actuator; and
    a control unit for either expanding or contracting the first and the second piezo-actuators.

7. The holographic apparatus of claim 6, wherein in case a high frequency voltage is applied to the first and the second piezo-actuators respectively, the first and the second piezo-actuators are expanded respectively.

* * * * *